(12) United States Patent
Bae et al.

(10) Patent No.: US 9,941,424 B2
(45) Date of Patent: Apr. 10, 2018

(54) SOLAR CELL

(75) Inventors: Do Won Bae, Seoul (KR); Hisun Pak, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 285 days.

(21) Appl. No.: 13/878,307

(22) PCT Filed: Apr. 27, 2011

(86) PCT No.: PCT/KR2011/003118
§ 371 (c)(1),
(2), (4) Date: Jan. 13, 2014

(87) PCT Pub. No.: WO2012/046935
PCT Pub. Date: Apr. 12, 2012

(65) Prior Publication Data
US 2015/0059842 A1 Mar. 5, 2015

(30) Foreign Application Priority Data
Oct. 6, 2010 (KR) .................. 10-2010-0097471

(51) Int. Cl.
*H01L 31/0224* (2006.01)
*H01L 31/0749* (2012.01)
(Continued)

(52) U.S. Cl.
CPC ........... *H01L 31/022433* (2013.01); *H01L 31/022425* (2013.01); *H01L 31/022466* (2013.01);
(Continued)

(58) Field of Classification Search
CPC ..... Y02E 10/50; Y02E 10/544; Y02E 10/542; Y02E 10/548; Y02E 10/54;
(Continued)

(56) References Cited

U.S. PATENT DOCUMENTS 4,647,711 A * 3/1987 Basol et al. .............. 136/256
5,688,366 A * 11/1997 Ichinose ......... H01L 31/022466
136/244

(Continued)

FOREIGN PATENT DOCUMENTS

CN 101562207 A 10/2009
JP S62-9682 A 1/1987
(Continued)

OTHER PUBLICATIONS

"Integrally." Collins English Dictionary—Complete & Unabridged 10th Edition. HarperCollins Publishers. Mar. 16, 2015. <Dictionary.com http://dictionary.reference.com/browse/integrally>.*
(Continued)

*Primary Examiner* — Devina Pillay
*Assistant Examiner* — Daniel P Malley, Jr.
(74) *Attorney, Agent, or Firm* — Saliwanchik, Lloyd & Eisenschenk

(57) ABSTRACT

A solar cell according to the embodiment includes a substrate; a first electrode layer on a substrate; a light absorbing layer on the first electrode layer; a second electrode layer including a transmissive conductive material on the light absorbing layer; and a grid electrode including a transmissive conductive material on the second electrode layer.

4 Claims, 2 Drawing Sheets

(51) Int. Cl.
*H01L 31/18* (2006.01)
*H01L 31/0468* (2014.01)

(52) U.S. Cl.
CPC ........... *H01L 31/022483* (2013.01); *H01L 31/022491* (2013.01); *H01L 31/0468* (2014.12); *H01L 31/0749* (2013.01); *H01L 31/1884* (2013.01); *Y02E 10/541* (2013.01)

(58) Field of Classification Search
CPC ..... H01L 31/022433; H01L 31/022425; H01L 31/022466; H01L 31/022491; H01L 31/0749; H01L 31/022483; H01L 31/022475
USPC .......................................................... 136/252
See application file for complete search history.

(56) References Cited

U.S. PATENT DOCUMENTS

| | | | | |
|---|---|---|---|---|
| 6,184,057 | B1* | 2/2001 | Van Andel | H01L 31/022466 136/244 |
| 7,750,555 | B2 | 7/2010 | Song et al. | |
| 7,998,877 | B1* | 8/2011 | Chadda | H01L 31/02363 257/E21.126 |
| 8,414,961 | B1* | 4/2013 | Robinson | H01L 31/022466 427/74 |
| 2002/0130605 | A1* | 9/2002 | Mueller et al. | 313/310 |
| 2003/0230337 | A1* | 12/2003 | Gaudiana et al. | 136/256 |
| 2010/0084013 | A1* | 4/2010 | Eo et al. | 136/255 |
| 2010/0123166 | A1 | 5/2010 | Bae | |
| 2010/0193019 | A1* | 8/2010 | Liu | H01L 31/022425 136/255 |
| 2010/0279458 | A1* | 11/2010 | Yeh | H01L 31/022425 438/98 |
| 2011/0277825 | A1* | 11/2011 | Fu et al. | 136/255 |
| 2011/0300661 | A1* | 12/2011 | Pearce et al. | 438/66 |

FOREIGN PATENT DOCUMENTS

| | | |
|---|---|---|
| JP | H06-104472 A | 4/1994 |
| JP | S06-318724 | 11/1994 |
| JP | 2003-249666 A | 9/2003 |
| KR | 10-0656357 B1 | 12/2006 |
| KR | 10-2007-0080330 A | 8/2007 |
| KR | 10-2009-0004262 A | 1/2009 |
| KR | 10-2009-0034078 A | 4/2009 |
| KR | 10-2010-0048043 A | 5/2010 |

OTHER PUBLICATIONS

"Laminated." Dictionary.com Unabridged. Random House, Inc. Mar. 16, 2015. <Dictionary.com http://dictionary.reference.com/browse/laminated>.*
NDT Education "Conductivity and Resistivity Values for Titanium & Alloys".*
Banyamin et al. "Electrical and Optical Properties of Fluorine Doped Tin Oxide Thin Films Prepared by Magnetro Sputtering".*
Liu et al., "Transparent conducting oxides for electrode applications in light emitting and absorbing devices", Sep. 6, 2010, Superlattices and Microstructures, 48, pp. 458-484.*
Office Action dated Feb. 13, 2015 in Japanese Application No. 2013-532700.
Office Action dated Jan. 26, 2015 in Chinese Application No. 201180038919.4.
International Search Report in International Application No. PCT/KR2011/003118, filed Apr. 27, 2011.
Notice of Allowance dated Jul. 5, 2012 in Korean Application No. 10-2010-0097471, filed Oct. 6, 2010.
Office Action dated Oct. 28, 2014 in Japanese Application No. 2013-532700.
Supplementary European Search Report dated May 23, 2017 in European Application No. 11830821.2.

* cited by examiner

SOLAR CELL

CROSS-REFERENCE TO RELATED APPLICATIONS

This application is the U.S. national stage application of International Patent Application No. PCT/KR2011/003118, filed Apr. 27, 2011, which claims priority to Korean Application No. 10-2010-0097471, filed Oct. 6, 2010, the disclosures of each of which are incorporated herein by reference in their entirety.

TECHNICAL FIELD

The disclosure relates to a solar cell.

BACKGROUND ART

Recently, as energy consumption is increased, a solar cell has been developed to convert solar energy into electrical energy. In such a solar cell, the improvement of the photoelectric conversion efficiency is an important factor.

In order to improve the photoelectric conversion efficiency, an opaque grid made from a metal is formed at a front surface of the solar cell. According to this method, the current collection characteristics can be improved because the grid has superior electric conductivity. However, a region where the opaque grid is located may become a dead zone that blocks transmission of the solar light, so the effective area of the solar cell may be reduced.

DISCLOSURE

Technical Problem

The embodiment provides a solar cell capable of improving the photoelectric conversion efficiency by improving current collection characteristics without reducing the effective area of the solar cell.

Technical Solution

A solar cell according to the embodiment includes a substrate; a first electrode layer on a substrate; a light absorbing layer on the first electrode layer; a second electrode layer including a transmissive conductive material on the light absorbing layer; and a grid electrode including a transmissive conductive material on the second electrode layer.

The grid electrode may include a transparent conductive material. The grid electrode includes at least one selected from the group consisting of aluminum-doped zinc oxide (AZO), fluorine-doped tin oxide (FTO), gallium-doped zinc oxide (GZO), and boron-doped zinc oxide (BZO).

A part of the grid electrode is integrally formed with the second electrode layer.

The grid electrode includes a metal. The grid electrode is formed by laminating at least two metal layers. The grid electrode includes a first metal layer formed on the second electrode layer and including one selected from the group consisting of Ni, Ag, Pt and an alloy thereof; and a second metal layer formed on the first metal layer and including Au.

The grid electrode includes a first layer formed on the second electrode layer and including a transparent conductive material; and a second layer formed on the first layer and including a metal.

The first layer includes at least one selected from the group consisting of aluminum-doped zinc oxide (AZO), fluorine-doped tin oxide (FTO), gallium-doped zinc oxide (GZO), and boron-doped zinc oxide (BZO), and the second layer includes at least one selected from the group consisting of Ni, Ag, Pt and an alloy thereof.

A ratio of a thickness of the grid electrode to a thickness of the second electrode layer is in a range of 0.5 to 3.

Advantageous Effects

According to the solar cell of the embodiment, the grid electrode is formed by using the transmissive conductive material, so that current collection characteristics can be improved without reducing the effective area of the solar cell. Thus, the photoelectric conversion efficiency of the solar cell can be effectively improved. In addition, the grid electrode may serve as the anti-reflection wall, so that the photoelectric conversion efficiency of the solar cell may be more improved. The grid electrode may be formed by using the transparent conductive material or a metal layer having a thin thickness. If a part of the grid electrode, which is formed by using the transparent conductive material, is integrally formed with the second electrode layer, the manufacturing process can be simplified and the junction characteristic can be improved. In addition, if a part of the grid electrode is formed by using the metal layer, the current collection characteristic can be more improved by the metal layer having the superior electric conductivity.

BEST MODE

Mode for Invention

In the description of the embodiments, it will be understood that when a layer (film), a region, a pattern or a structure is referred to as being "on" or "under" another layer (film), another region, another pad, or another pattern, it can be "directly" or "indirectly" on the other layer (film), the other region, the other pad, or the other pattern, or one or more intervening layers may also be present. Such a position of the layer has been described with reference to the drawings.

The size or the thickness of the layer (film), the region, the pattern or the structure may be modified exaggerated for the purpose of explanation and clarity. The size may not utterly reflect the actual size.

Hereinafter, the embodiment will be described in detail with reference to accompanying drawings.

Figure 1:
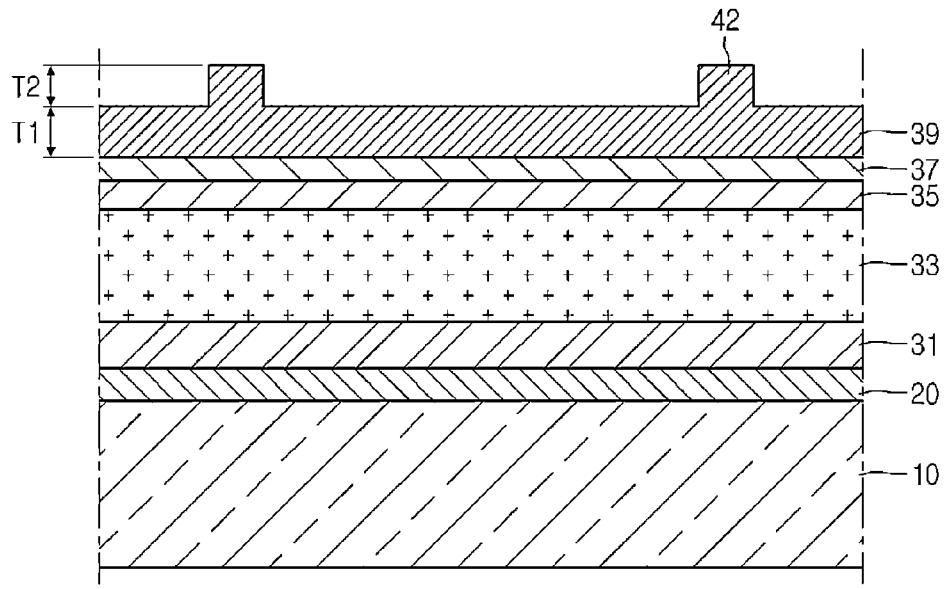
FIG. 1 is a schematic sectional view showing a solar cell according to the first embodiment.

FIG. 1 is a schematic sectional view showing a solar cell according to the first embodiment.

Referring to FIG. 1, the solar cell 100 according to the embodiment includes a substrate 10 on which a first electrode 31, a light absorbing layer 33, a second electrode layer 39 and a grid electrode 42 are sequentially formed. In addition, the solar cell 100 may further include a barrier layer 20, a buffer layer 35 and a high-resistance buffer layer 37. The structure of the solar cell 100 will be described below in more detail.

The substrate 10 has a plate shape and supports the first electrode layer 31, the light absorbing layer 33 and the second electrode layer 39 formed thereon. The substrate 10 may include an insulator, such as glass or plastic. For instance, the substrate 10 may include soda lime glass. However, the embodiment is not limited thereto. For instance, the substrate 10 may include a metallic substrate. That is, the substrate 10 may be formed by using a rigid material or a flexible material according to the property of the solar cell.

The barrier layer 20 formed on the substrate 10 may prevent materials of the substrate 10 from diffusing toward the first electrode layer 31. The barrier layer 20 may include oxide. For instance, the barrier layer 20 may include aluminum oxide, titanium oxide, magnesium oxide, or tungsten oxide. The barrier layer 20 is not an essential element and can be omitted.

The first electrode layer 31 is formed on the barrier layer 20. The first electrode layer 31 can be formed by using various conductive materials. For instance, the first electrode layer 31 may include Mo, Cu, Ni, Al and an alloy thereof. The first electrode layer 31 can be formed through various processes. For instance, the first electrode layer 31 can be formed by depositing Mo through the sputtering process.

In addition, the first electrode layer 31 may include at least two layers. In this case, the layers may be formed by using the homogeneous metal or heterogeneous metals. The first electrode layer 31 including at least two layers can be formed by performing the process twice under the different process conditions.

The light absorbing layer 33 is formed on the first electrode layer 31.

The light absorbing layer 33 may include a non-silicon semiconductor material. For instance, the light absorbing layer 33 may include group I-III-IV compounds. For instance, the light absorbing layer 33 may include Cu—In—Ga—Se (CIGS) compounds, Cu—In—Se (CIS) compounds, or Cu—Ga—Se (CGS) compounds.

In addition, the light absorbing layer 33 may include group II-IV compounds or III-IV compounds. For instance, the light absorbing layer 33 may include Cd—Te compounds or Ga—As compounds.

The light absorbing layer 33 may have an energy bandgap in the range of about 1 eV to about 1.8 eV. However, the embodiment is not limited thereto, and the light absorbing layer 33 may have various energy bandgaps.

The light absorbing layer 33 can be formed through various schemes, such as an evaporation scheme or a sputtering scheme.

As an example, a method for forming the CIGS light absorbing layer 33 through the evaporation scheme or the sputtering scheme will be described below.

According to the evaporation scheme, the CIGS light absorbing layer 33 is formed by simultaneously or separately evaporating Cu, In, Ga and Se.

According to the sputtering scheme, a metallic precursor layer is formed and then the selenization process is performed to form the CIGS light absorbing layer 33. That is, according to the sputtering scheme, the metallic precursor layer including Cu, In and Ga is formed by using a Cu target, an In target and a Ga target. Then, the selenization process is performed to form the CIGS light absorbing layer 33.

Otherwise, the sputtering process and the selenization process are simultaneously performed to form the CIGS light absorbing layer 33.

Although the method for manufacturing the CIGS light absorbing layer 33 has been described above, various types of light absorbing layers 33 can be formed by varying the target and the evaporation material according to the source materials.

The buffer layer 35 is formed on the light absorbing layer 33. The buffer layer 35 is provided to attenuate the difference in lattice constant and energy bandgap with respect to the second electrode 29. For instance, the buffer layer 35 may include CdS or ZnS. The buffer layer 35 can be formed through the chemical bath deposition (CBD). As an example, the method for forming the buffer layer 35 including CdS through the CBD will be described below in detail.

The buffer layer 35 including CdS can be formed by dipping the light absorbing layer 33 in a solution to form the buffer layer, in which $Cd^{2+}$ and S2− are excessively saturated, and then maintaining a predetermined reaction temperature for a predetermined time. For instance, the solution to form the buffer layer may include cadmium acetate or thiourea. In addition, a buffering agent or ammonia may be further added in the solution. In addition, the reaction temperature may be in the range of about 50° C. to about 100° C., but the embodiment is not limited thereto.

The high-resistance buffer layer 37 is formed on the buffer layer 35. The high-resistance buffer layer 37 is provided to prevent the buffer layer 35 from being damaged when the second electrode layer 39 is formed. For instance, the high-resistance buffer layer 37 may include ZnO. However, the embodiment is not limited thereto, but the high-resistance buffer layer 37 can be formed through various schemes by using various materials.

The second electrode layer 39 (or window layer) is formed on the high-resistance buffer layer 37. The second electrode layer 39 is transparent so the light can be incident into the second electrode layer 39. The second electrode layer 39 may be formed by using a transmissive conductive material serving as an electrode. In addition, the second electrode layer 39 has the characteristic of an N type semiconductor, so the second electrode layer 39 may form an N type semiconductor layer together with the buffer layer 35 and may form a PN junction together with the light absorbing layer 33 serving as a P type semiconductor layer.

To this end, for instance, the second electrode layer 39 may be formed by using a transparent conductive material, such as aluminum-doped zinc oxide (AZO), fluorine-doped tin oxide (FTO), gallium-doped zinc oxide (GZO), or boron-doped zinc oxide (BZO).

The grid electrode 42 is formed on the second electrode layer 39.

According to the embodiment, the grid electrode 42 and the second electrode layer 39 may be formed by using the same material. Thus, the junction characteristic between the grid electrode 42 and the second electrode layer 39 can be improved.

For instance, the grid electrode 42 may include a transparent conductive material, such as aluminum-doped zinc oxide (AZO), fluorine-doped tin oxide (FTO), gallium-doped zinc oxide (GZO), or boron-doped zinc oxide (BZO). That is, the grid electrode 42 may be formed by using a transmissive conductive material. Since a thickness of the transparent conductive material becomes thick at the region where the grid electrode 42 is formed, resistance may be lowered in that region as compared with other regions, so the current collection characteristic can be improved. In addition, according to the embodiment, the grid electrode 42 is formed by using the transmissive conductive material, so that the dead zone, which is formed by the metallic grid in the related art, may not be formed. That is, according to the embodiment, the current collection characteristic can be improved by the grid electrode 42 including the transmissive conductive material, so that the electric characteristic of the solar cell 100 can be improved and the effective area of the solar cell 100 can be enlarged. As a result, the photoelectric conversion efficiency of the solar cell 100 can be improved.

The second electrode 39 has a thickness T1 in the range of 0.5 mm to 1 mm. At this time, a ratio (T2/T1) of a thickness T2 of the grid electrode 42 to the thickness T1 of the second electrode layer 39 may be in the range of 0.5 to 5. If the above ratio (T2/T1) is satisfied, the resistance reduction effect by the grid electrode 42 can be appropriately maintained. In addition, the grid electrode 42 may serve as an anti-reflection wall, so quantity of light incident into the solar cell can be increased, thereby improving the photoelectric conversion efficiency.

If the above ratio (T2/T1) exceeds 3, the thickness of the grid electrode 42 is too thick, so the grid electrode 42 may not be stably formed and the thickness of the solar cell 100 may become thick due to the thickness T2 of the grid electrode 42. In addition, if the above ratio (T2/T1) is less than 0.5, the desired resistance reduction effect may not be achieved. However, the embodiment is not limited to the above-described ratio.

According to the embodiment, the grid electrode 42 can be integrally formed with the second electrode layer 39. Thus, the manufacturing process can be simplified as compared with the case where the grid electrode 42 is separately formed by using the material different from the material used to form the second electrode layer 39.

The second electrode layer 39 and/or the grid electrode 42 can be formed through various schemes, such as a sputtering scheme, an evaporation scheme or a spray scheme. However, the embodiment is not limited thereto, and various methods can be adopted to form the second electrode layer 39 and/or the grid electrode 42.

Figure 2:
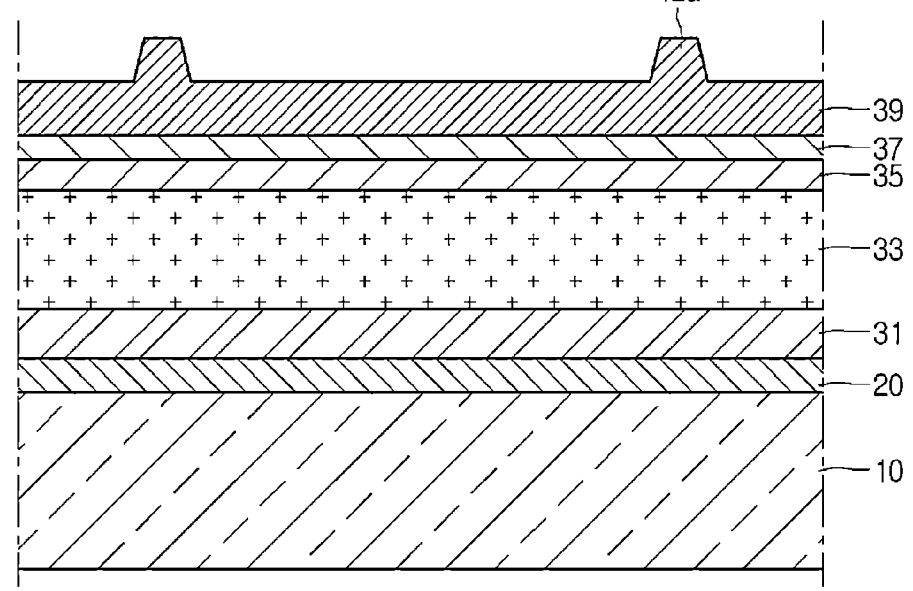
FIG. 2 is a schematic sectional view showing a modified example of a solar cell according to the first embodiment.

Although FIG. 1 shows the grid electrode 42 having a rectangular shape, the embodiment is not limited thereto. As shown in FIG. 2, the grid electrode 42a may have a sectional shape having a width gradually reduced upward.

Hereinafter, solar cells according to another embodiment will be described with reference to FIGS. 3 and 4. The description about the structure and elements identical to or the same as those of the first embodiment will be omitted and the following description will be made while focusing different parts.

Figure 3:
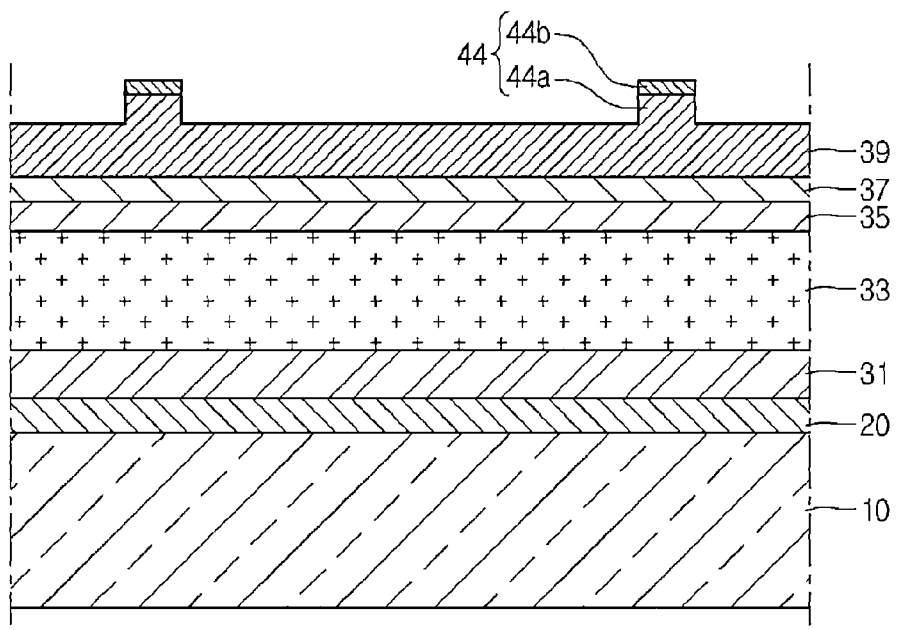
FIG. 3 is a schematic sectional view showing a solar cell according to the second embodiment.

FIG. 3 is a schematic sectional view showing a solar cell according to the second embodiment.

Referring to FIG. 3, the grid electrode 44 according to the second embodiment includes a first layer 44a formed by using a material the same as that of the second electrode layer 39, and a second layer 44b formed by using a material having resistance lower than that of the first layer 44a.

For instance, the first layer 44a may be formed by using a transparent conductive material, such as aluminum-doped zinc oxide (AZO), fluorine-doped tin oxide (FTO), gallium-doped zinc oxide (GZO), or boron-doped zinc oxide (BZO). In addition, the second layer 44b may be formed by using a metal, such as Ni, Ag, Pt, Au or an alloy thereof. The second layer 44b has a thin thickness to allow light to pass therethrough. That is, the second layer 44b may have light transmittance although the second layer 44b is formed by the metal.

As described above, since the grid electrode 44 has the first layer 44a including the transparent conductive material and the second layer 44b including the metal layer having the light transmittance, the grid electrode 44 may include the transmissive conductive material.

According to the second embodiment, the first layer 44a, which is a part of the grid electrode 44, is formed by using the material the same as that of the second electrode layer 39, so the junction characteristic between the second electrode layer 39 and the grid electrode 44 can be improved. In addition, the second layer 44b, which is another part of the grid electrode 44, is formed by using the metal having resistance lower than that of the second electrode layer 39, so that the resistance reduction effective can be improved.

That is, according to the second embodiment, the grid electrode 44 includes the first and second layers 44a and 44b, which are formed by using different materials, so that the junction and resistance characteristics can be simultaneously improved. Thus, the photoelectric conversion efficiency of the solar cell can be more improved.

Figure 4:
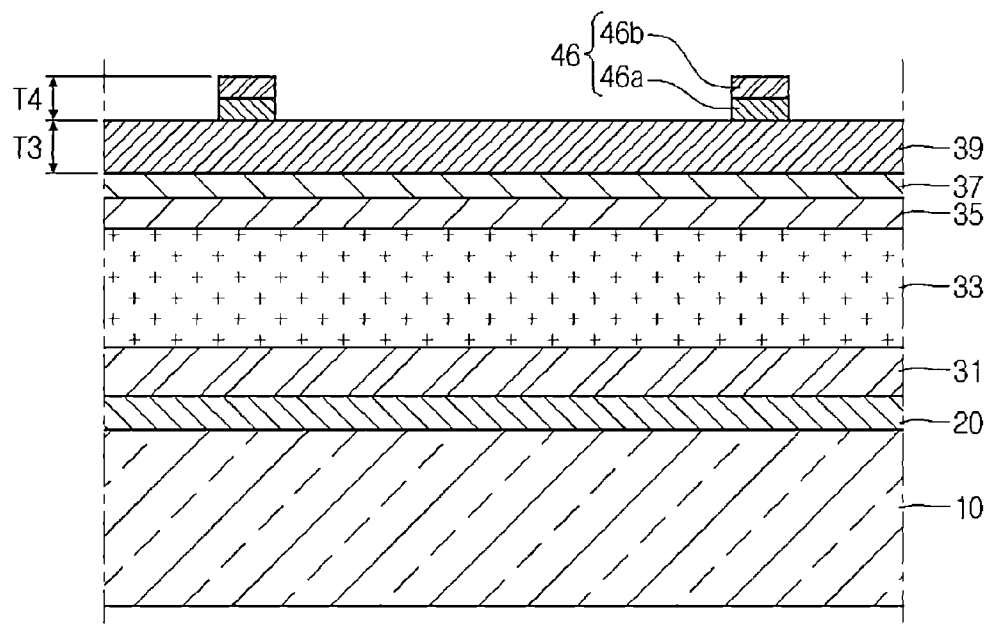
FIG. 4 is a schematic sectional view showing a solar cell according to the third embodiment.

FIG. 4 is a schematic sectional view showing a solar cell according to the third embodiment.

Referring to FIG. 4, a grid electrode 46 according to the third embodiment can be formed by sequentially laminating first and second metal layers 46a and 46b, which are different from each other, on the second electrode layer 39.

For instance, the first metal layer 46a may include Ni, Ag, Pt or an alloy thereof and the second metal layer 46b may include Au. The first and second metal layers 46a and 46b have a thin thickness to allow light to pass therethrough, so the grid electrode may have the light transmittance and conductivity.

According to the third embodiment, the grid electrode 46 is formed by using the metal, so that the resistance can be more reduced. Thus, the photoelectric conversion efficiency of the solar cell can be more improved.

When taking the resistance and transmittance of the grid electrode 46 into consideration, a ratio (T4/T3) of a thickness T4 of the grid electrode 46 to a thickness T3 of the second electrode layer 39 may be in the range of 0.3 to 3.

The first and second metal layers 46a and 46b can be formed through the sputtering scheme or the evaporation scheme by using a mask (not shown). However, the embodiment is not limited thereto, but various schemes can be adopted to form the first and second metal layers 46a and 46b.

Although it has been described and shown in FIG. 4 that the grid electrode 46 includes two layers of the first and second metal layers 46a and 46b, the embodiment is not limited thereto. For instance, the grid electrode 46 can be formed by laminating at least three metal layers. That is, it is sufficient if the grid electrode 46 is formed by laminating at least two metal layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a substrate;
   a first electrode layer on the substrate;
   a light absorbing layer on the first electrode layer;
   a second electrode layer including a transmissive conductive material on the light absorbing layer,
   wherein the second electrode layer includes a bottom surface and a top surface opposite from the bottom surface; and
   a grid electrode protruded from the top surface of the second electrode layer,
   wherein the grid electrode includes a top surface and a bottom portion adjacent to the top surface of the second electrode layer;
   wherein a width of the bottom portion of the grid electrode is greater than a width of the top surface of the grid electrode;
   wherein the grid electrode comprises the same material as that of the second electrode layer;
   wherein the grid electrode is integrally formed with the second electrode layer;
   wherein the first electrode comprises Mo, Cu, Ni, or Al;
   wherein the first electrode is in direct physical contact with the substrate;
   wherein the light absorbing layer comprises Cu—In—Ga—Se (CIGS) compounds, Cu—In—Se— (CIS) compounds, or Cu—Ga—Se (CGS) compounds;
   wherein the second electrode layer has a thickness in a range of from 0.5 mm to 1 mm;
   wherein a thickness of the grid electrode is greater than a thickness of the second electrode layer; and
   wherein a ratio of a thickness of the grid electrode to a thickness of the second electrode layer is in a range of from 1.5 to 3.

2. The solar cell of claim 1, wherein the grid electrode includes a transparent conductive material.

3. The solar cell of claim 2, wherein the grid electrode includes at least one selected from the group consisting of aluminum-doped zinc oxide (AZO), fluorine-doped tin oxide (FTO), gallium-doped zinc oxide (GZO), and boron-doped zinc oxide (BZO).

4. The solar cell of claim 1, wherein the second electrode layer has the characteristics of an N type semiconductor.

* * * * *